United States Patent
Lee et al.

(10) Patent No.: US 11,651,730 B2
(45) Date of Patent: May 16, 2023

(54) DISPLAY DEVICE INCLUDING DUAL DATA LINES

(71) Applicant: LG DISPLAY CO., LTD., Seoul (KR)

(72) Inventors: Boo-Heung Lee, Paju-si (KR); Eui-Hyun Chung, Paju-si (KR); Da-Hye Shim, Paju-si (KR); Sung-Hun Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 17/536,818

(22) Filed: Nov. 29, 2021

(65) Prior Publication Data
US 2022/0084464 A1    Mar. 17, 2022

(30) Foreign Application Priority Data
Dec. 24, 2020    (KR) ........................ 10-2020-0183350

(51) Int. Cl.
*G09G 3/3208*    (2016.01)
*H01L 27/32*    (2006.01)

(52) U.S. Cl.
CPC ....... *G09G 3/3208* (2013.01); *H01L 27/3272* (2013.01); *H01L 27/3276* (2013.01); *G09G 2300/0439* (2013.01); *G09G 2300/0842* (2013.01); *G09G 2310/0297* (2013.01); *G09G 2310/08* (2013.01)

(58) Field of Classification Search
CPC .... G09G 3/32–3291; G09G 2300/0809–0871; G09G 3/3674; G09G 3/3685; G09G 2300/0408; G09G 3/3208; G09G 3/3233; G09G 2300/0426; G09G 2300/0439; G09G 2300/0819; G09G 2300/0842; G09G 2300/0861; G09G 2310/0262; G09G 2310/0297; G09G 2310/08; G09G 2320/043; H01L 27/3272; H01L 27/3276
See application file for complete search history.

(56) References Cited

U.S. PATENT DOCUMENTS

| | | | |
|---|---|---|---|
| 2014/0184665 A1* | 7/2014 | Yoon | G09G 3/3241 345/82 |
| 2016/0307504 A1* | 10/2016 | Hung | G09G 3/3233 |
| 2017/0011702 A1* | 1/2017 | Yamagishi | G09G 3/3696 |
| 2018/0174511 A1* | 6/2018 | Kim | H01L 27/3218 |
| 2020/0090585 A1* | 3/2020 | Shi | G09G 3/3233 |

FOREIGN PATENT DOCUMENTS

KR    10-2020-0070868 A    6/2020

* cited by examiner

*Primary Examiner* — Amr A Awad
*Assistant Examiner* — Aaron Midkiff
(74) *Attorney, Agent, or Firm* — Morgan, Lewis & Bockius LLP (57) ABSTRACT

A display device includes a gate line extending in a first direction, a left data line and a right data line extending in a second direction and crossing the gate line, and a plurality of sub-pixels arranged along the first and second directions, wherein the sub-pixels of a pixel row of the first direction are connected to a same gate line, and the sub-pixels of a pixel row of the second direction are alternately connected to the left data line and the right data line.

15 Claims, 7 Drawing Sheets

DISPLAY DEVICE INCLUDING DUAL DATA LINES

CROSS-REFERENCE TO RELATED APPLICATION

The present application claims priority from and the benefit under 35 U.S.C § 119(a) of Korean Patent Application No. 10-2020-0183350 filed on Dec. 24, 2020, which is hereby incorporated by reference in its entirety.

BACKGROUND

Technical Field

The present disclosure relates to a display device, and more particularly, to a display device including dual data lines that provides data voltages to a sub-pixel through a left data line and a right data line.

Discussion of the Related Art

Recently, flat panel display devices have been widely developed and applied to various fields because of their thin profile, light weight, and low power consumption.

Among the flat panel display devices, liquid crystal display devices (LCD), organic light-emitting diode display devices (OLED), micro light-emitting diode display devices (µ-LED), and quantum dot light-emitting diode display devices (QLED) have been widely developed and applied.

Theses display devices display an image by supplying a data voltage output from a data driving part to pixels of a display panel. As the resolution increases, the number of pixels increases, and a time of applying the data voltage to each pixel decreases, so that the charging time for a data line decreases.

In addition, as the number of pixels increases, the size and number of the data driving part increases, so that the manufacturing costs of the display device increases.

SUMMARY

Accordingly, embodiments of the present disclosure are directed to a display device that substantially obviates one or more of the problems due to limitations and disadvantages of the related art.

An aspect of the present disclosure is to provide a display device including dual data lines that secures sufficient charging time.

Another aspect of the present disclosure is to provide a display device including dual data lines that prevents the size and number of the data driving unit from increasing and reduces the manufacturing costs.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a display device comprises a gate line extending in a first direction, a left data line and a right data line extending in a second direction and crossing the gate line, and a plurality of sub-pixels arranged along the first and second directions, wherein the sub-pixels of a pixel row of the first direction are connected to a same gate line, and the sub-pixels of a pixel row of the second direction are alternately connected to the left data line and the right data line.

It is to be understood that both the foregoing general description and the following detailed description are by example and explanatory and are intended to provide further explanation of the present disclosure as claimed.

BRIEF DESCRIPTION OF THE DRAWINGS

The accompanying drawings, which are included to provide a further understanding of the present disclosure and which are incorporated in and constitute a part of this application, illustrate an embodiment of the present disclosure and together with the description serve to explain principles of the present disclosure. In the drawings.

DETAILED DESCRIPTION

Reference will now be made in detail to exemplary embodiments of the disclosure, examples of which are illustrated in the accompanying drawings.

Figure 1:
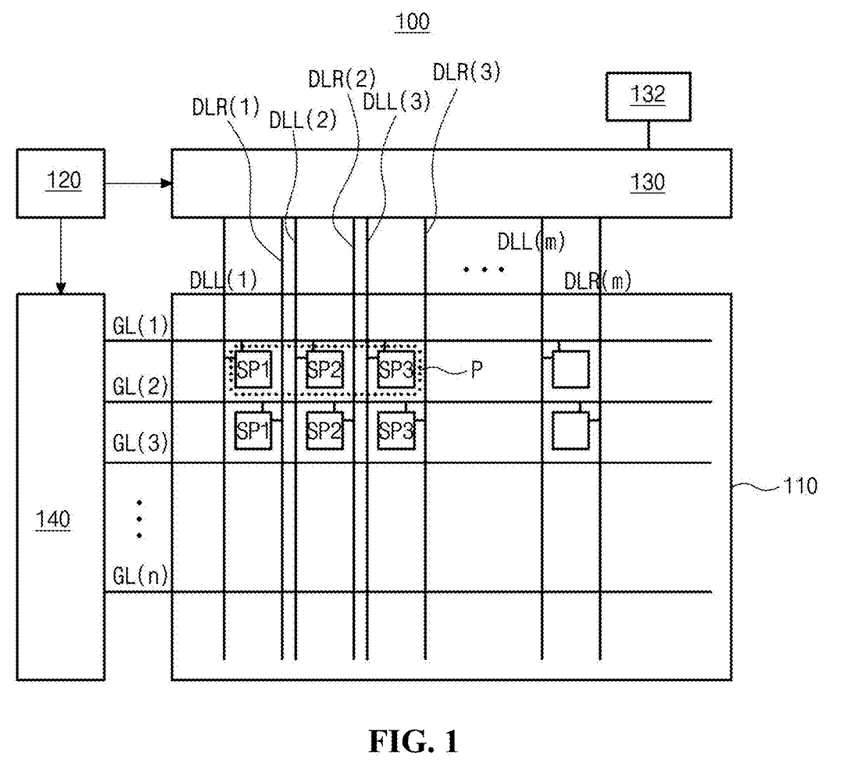
FIG. 1 is a schematic view of a display device according to an embodiment of the present disclosure.

FIG. 1 is a schematic view of a display device according to an embodiment of the present disclosure. For example, the display device can be an organic light-emitting diode display device.

In FIG. 1, the display device according to the embodiment of the present disclosure includes a display panel 110, a timing controlling part 120, a data driving part 130, a gamma part 132, and a gate driving part 140.

The timing controlling part 120 generates an image data, a data control signal, and a gate control signal using an image signal and timing signals of a data enable signal, a horizontal synchronization signal, a vertical synchronization signal, and a clock transmitted from an external system (not shown) such as a graphic card or a television system. The timing controlling part 120 transmits the image data and the data control signal to the data driving part 130 and transmits the gate control signal to the gate driving part 140.

The data driving part 130 generates a data voltage of a data signal using the data control signal and the image data transmitted from the timing controlling part 120 and applies the data voltage to a data line DLL(m) and DLR(m) of the display panel 110. Here, m is a natural number.

The gamma part 132 transmits the data voltage corresponding to the image data of the data driving part 130 to the data driving part 130.

The gate driving part 140 generates a gate voltage of a gate signal using the gate control signal transmitted from the timing controlling part 120 and applies the gate voltage to a gate line GL(n) of the display panel 110. Here, n is a natural number.

The gate driving part 140 may have a gate-in-panel (GIP) type where the gate driving part 140 is disposed on a substrate of the display panel 110 on which the gate line GL(n), the data line DLL(m) and DLR(m), and a pixel P are formed.

The display panel 110 displays an image using the gate voltage and the data voltage. To do this, the display panel 110 includes a plurality of pixels P, a plurality of gate lines GL(n), and a plurality of left data lines DLL(m) and right data lines DLR(m), which are disposed in a display area.

Each of the plurality of pixels P includes first, second, and third sub-pixels SP1, SP2, and SP3, and the gate lines GL(n) and the left and right data lines DLL(m) and DLR(m) cross each other to define the first, second, and third sub-pixels SP1, SP2, and SP3. For example, the first, second, and third sub-pixels SP1, SP2, and SP3 may be red, green, and blue sub-pixels, respectively.

The left data line DLL(m) and the right data line DLR(m) may be disposed at left and right sides of each sub-pixel SP1, SP2, and SP3, respectively. That is, each sub-pixel SP1, SP2, and SP3 is located between the left data line DLL(m) and the right data line DLR(m).

Each of the first, second, and third sub-pixels SP1, SP2, and SP3 is connected to one gate line GL(n) and one left data line DLL(m) or one right data line DLR(m).

Here, the first, second, and third sub-pixels SP1, SP2, and SP3 of one horizontal pixel row are connected to the same gate line GL(n), and the first, second, and third sub-pixels SP1, SP2, and SP3 of one vertical pixel row are alternately connected to the left data line DLL(m) and the right data line DLR(m). Accordingly, the first, second, and third sub-pixels SP1, SP2, and SP3 of one horizontal pixel row are connected to the left data line DLL(m), and the first, second, and third sub-pixels SP1, SP2, and SP3 of the next horizontal pixel row are connected to the right data line DLR(m).

For example, when n is 1, in the first horizontal pixel row of the nth horizontal pixel row, the first sub-pixel SP1 can be connected to the first gate line GL(1) and the first left data line DLL(1), the second sub-pixel SP2 can be connected to the first gate line GL(1) and the second left data line DLL(2), and the third sub-pixel SP3 can be connected to the first gate line GL(1) and the third left data line DLL(3).

In addition, when n is 1, in the second horizontal pixel row of the (n+1)th horizontal pixel row, the first sub-pixel SP1 can be connected to the second data line GL(2) and the first right data line DLR(1), the second sub-pixel SP2 can be connected to the second gate line GL(2) and the second right data line DLR(2), and the third sub-pixel SP3 can be connected to the second gate line GL(2) and the third right data line DLR(3).

When the display device 100 is an organic light-emitting diode display device, each of the first, second, and third sub-pixels SP1, SP2, and SP3 can include a plurality of thin film transistors such as a switching thin film transistor, a driving thin film transistor, and a sensing thin film transistor, a storage capacitor, and a light-emitting diode, and this will be described in detail later.

Figure 2:
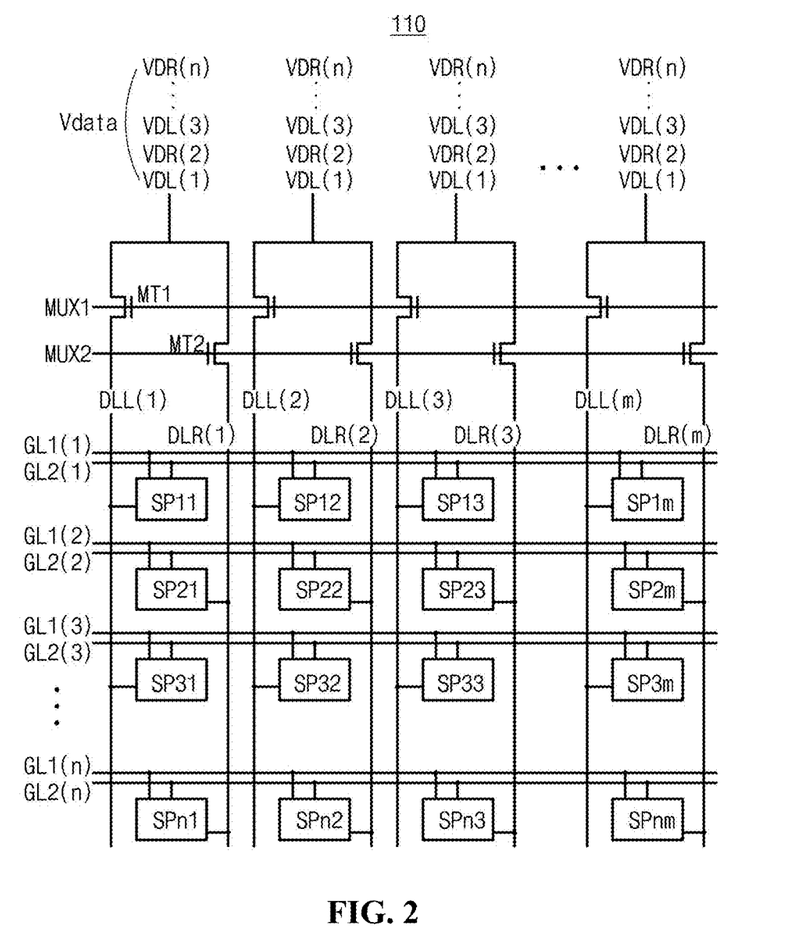
FIG. 2 is a schematic view illustrating a configuration of a display panel of a display device according to the embodiment of the present disclosure.

FIG. 2 is a schematic view illustrating a configuration of a display panel of a display device according to the embodiment of the present disclosure, and it is described with reference to FIG. 1 together.

In FIG. 2, the display panel 110 according to the embodiment of the present disclosure includes a plurality of first and second mux switches MT1 and MT2 and a plurality of sub-pixels SPnm. Here, n and m are natural numbers.

Each sub-pixel is connected to one gate line GL(n) and one left data line DLL(m) or right data line DLR(m).

Each gate line GL(n) can include a first gate line GL1(n) and a second gate line GL2(n). The sub-pixels SPnm of one horizontal pixel row are connected to both the first gate line GL1(n) and the second gate line GL2(n).

The sub-pixels SP11, SP12, SP13, . . . , and SP1m of the first horizontal pixel row are connected to the left data lines DLL(m), more particularly, first, second, third, . . . , and mth left data lines DLL(1), DLL(2), DLL(3), . . . , and DLL(m). The sub-pixels SP21, SP22, SP23, . . . , and SP2m of the second horizontal pixel row are connected to the right data lines DLR(m), more particularly, first, second, third, . . . , and mth right data lines DLR(1), DLR(2), DLR(3), . . . , and DLR(m). The sub-pixels SP31, SP32, SP33, . . . , and SP3m of the third horizontal pixel row are connected to the left data lines DLL(m), more particularly, first, second, third, . . . , and mth left data lines DLL(1), DLL(2), DLL(3), . . . , and DLL(m). The sub-pixels SPn1, SPn2, SPn3, . . . , and SPnm of the nth horizontal pixel row are connected to the right data lines DLR(m), more particularly, first, second, third, . . . , and mth right data lines DLR(1), DLR(2), DLR(3), . . . , and DLR(m).

Here, it is shown up to the sub-pixels SPn1, SPn2, SPn3, . . . , and SPnm of the nth horizontal pixel row. However, the present disclosure is not limited thereto, and an (n+1)th horizontal pixel row can be further provided. Further, it is illustrated up to the sub-pixels SP1m, SP2m, SP3m, . . . , and SPnm of the mth vertical pixel row. However, the present disclosure is not limited thereto, and an (m+1)th vertical pixel row can be further provided.

The plurality of first and second mux switches MT1 and MT2 sequentially transmit a plurality of data voltages Vdata output from a plurality of buffer (not shown) of the data driving part 130 to the data lines DLL(m) and DLR(m) according to first and second mux signals MUX1 and MUX2.

Here, the first mux switches MT1 are connected to the left data liens DLL(m), and the second mux switches MT2 are connected to the right data lines DLR(m). The first and second mux switches MT1 and MT2 corresponding to one vertical pixel row are connected to one output terminal of the data driving part 130, that is, a channel.

The plurality of first mux switches MT1 can sequentially transmit the left data voltages VDL to the left data lines DLL(m) according to the first mux signal MUX1. The plurality of second mux switches MT2 can sequentially transmit the right data voltages VDR to the right data lines DLR(m) according to the second mux signal MUX2.

Accordingly, first data voltages VDL(1) of the left data voltages are applied to the sub-pixels SP11, SP12, SP13, . . . , and SP1m of the first horizontal pixel row, second data voltages VDR(2) of the right data voltages are applied to the sub-pixels SP21, SP22, SP23, . . . , and SP2m of the second horizontal pixel row, third data voltages VDL(3) of the left data voltages are applied to the sub-pixels SP31, SP32, SP33, . . . , and SP3m of the third horizontal pixel row, and nth data voltages VDR(n) of the right data voltages are applied to the sub-pixels SPn1, SPn2, SPn3, . . . , and SPnm of the nth horizontal pixel row.

The plurality of sub-pixels SPnm display an image using the plurality of data voltages Vdata transmitted through the plurality of first and second mux switches MT1 and MT2 and the data lines DLL(m) and DLR(m).

As described above, in the display device 100 according to the embodiment of the present disclosure, the data voltages Vdata sequentially output from one output terminal of the data driving part 130, that is, the channel are sequentially transmitted to adjacent sub-pixels SPnm of one vertical pixel row through the first and second mux switches MT1 and MT2 of the display panel 110.

Accordingly, the number of output terminals of the data driving part 130, that is, the number of pins is not increased.

In addition, the sampling time can be increased by alternately connecting the sub-pixels SPnm of one vertical pixel row to the left data line DLL(m) and the right data line DLR(m).

Figure 3:
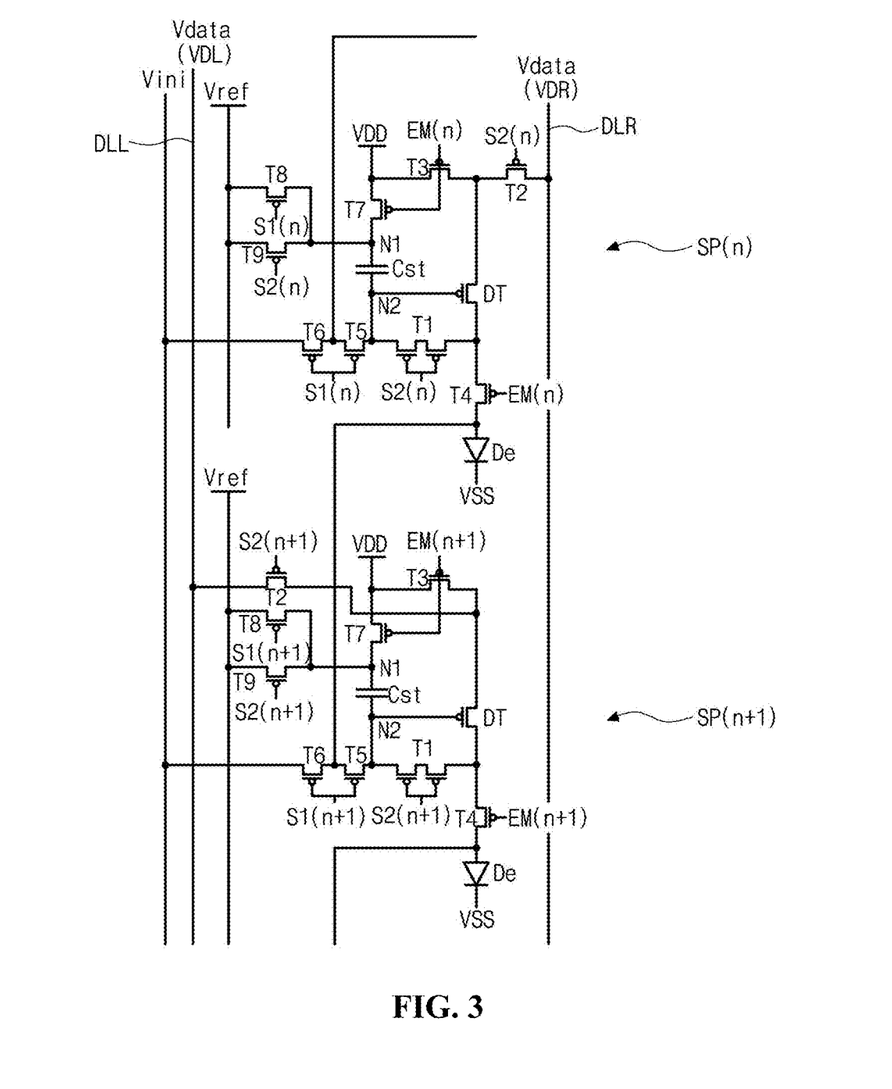
FIG. 3 is a circuit diagram of sub-pixels of a display device according to the embodiment of the present disclosure.

FIG. 3 is a circuit diagram of sub-pixels of a display device according to the embodiment of the present disclosure and shows an organic light-emitting diode display device as an example. FIG. 3 shows an nth sub-pixel SP(n) and an (n+1)th sub-pixel SP(n+1) of one vertical pixel row, and it is described with reference to FIG. 2 together.

In FIG. 3, each sub-pixel SP(n) and SP(n+1) of a display panel of the display device according to the embodiment of the present disclosure includes a driving transistor DT, first to ninth transistors T1 to T9, a storage capacitor Cst, and a light-emitting diode De. Here, a first electrode of the storage capacitor Cst is connected to a first node N1 and a second electrode of the storage capacitor Cst is connected to a second node N2.

For example, the driving transistor DT and the first to ninth transistors T1 to T9 can be P-type transistors. However, the present disclosure is not limited thereto, and the driving transistor DT and the first to ninth transistors T1 to T9 can be N-type transistors.

The driving transistor DT is switched according to a voltage of the second electrode of the storage capacitor Cst, that is, the voltage of the second node, and each of the first to ninth transistors T1 to T9 is switched according to one of a first gate voltage S1($n$) and S1($n$+1), a second gate voltage S2($n$) and S2($n$+1), and an emission voltage EM(n) and EM(n+1).

Specifically, the driving transistor DT can be switched according to the voltage of the second electrode of the storage capacitor Cst. The gate electrode of the driving transistor DT can be connected to the second electrode of the storage capacitor Cst, the drain electrode of the first transistor T1, and the source electrode of the fifth transistor T5. In addition, the source electrode of the driving transistor DT can be connected to the drain electrode of the second transistor T2 and the source electrode of the third transistor T3, and the drain electrode of the driving transistor DT can be connected to the source electrodes of the first and fourth transistors T1 and T4.

The first transistor T1 can be switched according to the second gate voltage S2($n$) and S2($n$+1). The gate electrode of the first transistor T1 can be connected the second gate line GL2($n$) and GL2($n$+1) and can receive the second gate voltage S2($n$) and S2($n$+1). The source electrode of the first transistor T1 can be connected to the drain electrode of the driving transistor DT and the source electrode of the fourth transistor T4. In addition, the drain electrode of the first transistor T1 can be connected to the second electrode of the storage capacitor Cst, the gate electrode of the driving transistor DT, and the source electrode of the fifth transistor T5. The first transistor T1 can have a dual gate structure.

The second transistor T2, which is a switching transistor, is switched according to the second gate voltage S2($n$) and S2($n$+1) to transmit the data voltage Vdata. The gate electrode of the second transistor T2 can be connected to the second gate line GL2($n$) and GL2($n$+1) and can receive the second gate voltage S2($n$) and S2($n$+1). In addition, the source electrode of the second transistor T2 can be connected to the left data line DLL or the right data line DLR to transmit the left data voltage VDL or the right data voltage VDR. The drain electrode of the second transistor T2 can be connected to the source electrode of the driving transistor DT and the source electrode of the third transistor T3.

For example, the source electrode of the second transistor T2 of the nth sub-pixel SP(n) can be connected to the right data line DLR to transmit the right data voltage VDR, and the source electrode of the second transistor T2 of the (n+1)th sub-pixel SP(n+1) can be connected to the left data line DLL to transmit the left data voltage VDL.

The third transistor T3 can be switched according to the emission voltage EM(n) and EM(n+1). The gate electrode of the third transistor T3 can receive the emission voltage EM(n) and EM(n+1), and the source electrode of the third transistor T3 can be connected to the source electrode of the driving transistor DT and the drain electrode of the second transistor T2. In addition, the drain electrode of the third transistor T3 can be connected to the source electrode of the seventh transistor T7 and can receive the high potential voltage VDD.

The fourth transistor T4 can be switched according to the emission voltage EM(n) and EM(n+1). The gate electrode of the fourth transistor T4 can receive the emission voltage EM(n) and EM(n+1), and the source electrode of the fourth transistor T4 can be connected to the drain electrode of the driving transistor DT and the source electrode of the first transistor T1. In addition, the drain electrode of the fourth transistor T4 can be connected to the anode of the light-emitting diode De.

Further, the drain electrode of the fourth transistor T4 can be connected to the drain electrode of the fifth transistor T5 and the source electrode of the sixth transistor T6 of the next horizontal pixel row. Namely, the drain electrode of the fourth transistor T4 of the nth sub-pixel SP(n) can be connected to the drain electrode of the fifth transistor T5 and the source electrode of the sixth transistor T6 of the (n+1)th sub-pixel SP(n+1).

The fifth transistor T5 can be switched according to the first gate voltage S1($n$) and S1($n$+1). The gate electrode of the fifth transistor T5 can be connected to the first gate line GL1($n$) and GL1($n$+1) and can receive the first gate voltage S1($n$) and S1($n$+1). In addition, the source electrode of the fifth transistor T5 can be connected to the gate electrode of the driving transistor DT, the second electrode of the storage capacitor Cst, and the drain electrode of the first transistor T1. Further, the drain electrode of the fifth transistor T5 can be connected to the source electrode of the sixth transistor T6 and can also be connected to the anode electrode of the light-emitting diode De of the previous horizontal pixel row.

The sixth transistor T6 can be switched according to the first gate voltage S1($n$) and S1($n$+1). The gate electrode of the sixth transistor T6 can be connected to the first gate line GL1($n$) and GL1($n$+1) and can receive the first gate voltage S1($n$) and S1($n$+1). In addition, the source electrode of the sixth transistor T6 can be connected to the drain electrode of the fifth transistor T5 and can also be connected to the anode of the light-emitting diode De of the previous horizontal pixel row. Further, the drain electrode of the sixth transistor T6 can receive the initialization voltage Vini.

The fifth and sixth transistors T5 and T6 can form a dual gate structure. Accordingly, an area for the fifth and sixth transistors T5 and T6 can be reduced, thereby providing a structure that is advantageous for securing an area of the left data line DLL and the right data line DLR.

The seventh transistor T7 can be switched according to the emission voltage EM(n) and EM(n+1). The gate electrode of the seventh transistor T7 can receive the emission voltage EM(n) and EM(n+1). In addition, the source electrode of the seventh transistor T7 can be connected to the drain electrode of the third transistor T3 and can receive the high potential voltage VDD. Further, the drain electrode of the seventh transistor T7 can be connected to the first electrode of the storage capacitor Cst and the source electrodes of the eighth and ninth transistors T8 and T9.

The eighth transistor T8 can be switched according to the first gate voltage S1($n$) and S1($n$+1). The gate electrode of the eighth transistor T8 can be connected to the first gate line GL1($n$) and GL1($n$+1) and can receive the first gate voltage S1($n$) and S1($n$+1). In addition, the source electrode of the eighth transistor T8 can be connected to the first electrode of the storage capacitor Cst, the drain electrode of the seventh transistor T7, and the source electrode of the ninth transistor T9. Further, the drain electrode of the eighth transistor T8 can be connected to the drain electrode of the ninth transistor T9 and can receive the reference voltage Vref.

The ninth transistor T9 can be switched according to the second gate voltage S2($n$) and S2($n$+1). The gate electrode of the ninth transistor T9 can be connected to the second gate line GL2($n$) and GL2($n$+1) and can receive the second gate voltage S2($n$) and S2($n$+1). In addition, the source electrode of the ninth transistor T9 can be connected to the first electrode of the storage capacitor Cst, the drain electrode of the seventh transistor T7, and the source electrode of the eighth transistor T8. Further, the drain electrode of the ninth transistor T8 can be connected to the drain electrode of the eighth transistor T8 and can receive the reference voltage Vref.

The storage capacitor Cst can be connected between the high potential voltage VDD and the driving transistor DT. Specifically, the first electrode of the storage capacitor Cst can be connected to the drain electrode of the seventh transistor T7 and the source electrodes of the eighth and ninth transistors T8 and T9. In addition, the second electrode of the storage capacitor Cst can be connected to the gate electrode of the driving transistor DT, the drain electrode of the first transistor T1, and the source electrode of the fifth transistor T5.

The light-emitting diode De can be connected between the fourth transistor T4 and the low potential voltage VSS and can emit light of luminance proportional to the current of the driving transistor DT. The anode of the light-emitting diode De can be connected to the drain electrode of the fourth transistor T4, and the cathode of the light-emitting diode De can receive the low potential voltage VSS. In addition, the anode of the light-emitting diode De can be connected to the drain electrode of the fifth transistor T5 and the source electrode of the sixth transistor T6 of the next horizontal pixel row.

In each sub-pixel SP of the display device, the first to ninth transistors T1 to T9 and the driving transistor DT operate by being divided into an initialization period, a sampling period, and an emission period, and it will be described with reference to FIG. 4.

Figure 4:
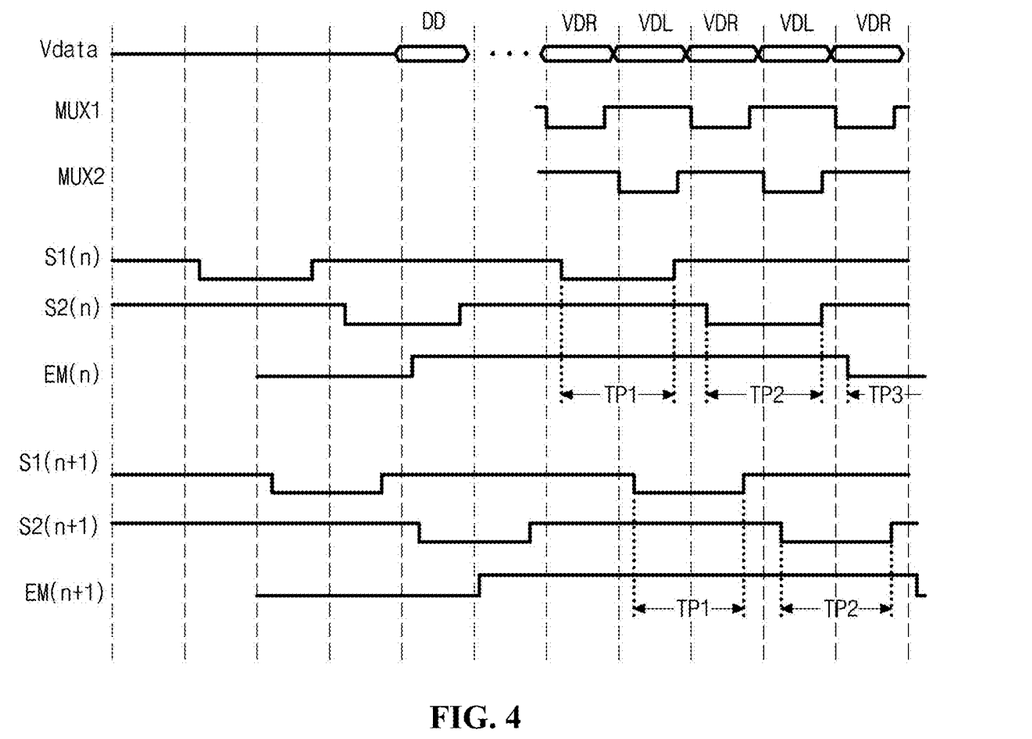
FIG. 4 is a driving timing chart of a display device according to the embodiment of the present disclosure.

FIG. 4 is a driving timing chart of a display device according to the embodiment of the present disclosure, and it is described with reference to FIG. 3 together.

As shown in FIG. 4, in the nth sub-pixel SP(n), during the initialization period TP1, the fifth and sixth transistors T5 and T6 and the eighth transistor T8 can be turned on by the first gate voltage S1($n$). In addition, the first, second, and ninth transistors T1, T2, and T9 can be turned off by the second gate voltage S2($n$). Further, the third, fourth, and seventh transistors T3, T4, and T7 can be turned off by the emission voltage EM(n). Therefore, the voltage of the first electrode of the storage capacitor Cst becomes the reference voltage Vref, and the voltage of the second electrode of the storage capacitor Cst becomes the initialization voltage Vini. Accordingly, the voltage of the gate electrode of the driving transistor DT becomes the initialization voltage Vini. Moreover, the voltage of the anode of the light-emitting diode De of the previous sub-pixel becomes the initialization voltage Vini. For example, the voltage of the first node N1 of the storage capacitor Cst becomes the reference voltage Vref, and the voltage of the second node N2 of the storage capacitor Cst becomes the initialization voltage Vini. Accordingly, the voltage of the gate electrode of the driving transistor DT becomes the initialization voltage Vini. Further, the voltage of the anode of the light-emitting diode De of the (n−1)th sub-pixel SP(n−1) becomes the initialization voltage Vini.

During the sample period TP2, the fifth and sixth transistors T5 and T6 and the eighth transistor T8 can be turned off by the first gate voltage S1($n$). In addition, the first, second, and ninth transistors T1, T2, and T9 can be turned on by the second gate voltage S2($n$). Further, the third, fourth, and seventh transistors T3, T4, and T7 can be turned off by the emission voltage EM(n). Therefore, the voltage of the first electrode of the storage capacitor Cst is maintained at the reference voltage Vref, and the voltage of the second electrode of the storage capacitor Cst becomes a value obtained by subtracting the threshold voltage Vth of the driving transistor DT from the right data voltage VDR, that is, VDR-Vth. Accordingly, the voltage of the gate electrode of the driving transistor DT becomes the value VDR-Vth obtained by subtracting the threshold voltage Vth of the driving transistor DT from the right data voltage VDR. For example, the voltage of the first node N1 of the storage capacitor Cst is maintained at the reference voltage Vref, and the voltage of the second node N2 of the storage capacitor Cst becomes the value VDR-Vth obtained by subtracting the threshold voltage Vth of the driving transistor DT from the right data voltage VDR. Accordingly, the voltage of the gate electrode of the driving transistor DT becomes the value VDR-Vth obtained by subtracting the threshold voltage Vth of the driving transistor DT from the right data voltage VDR.

During the emission period TP3, the fifth and sixth transistors T5 and T6 and the eighth transistor T8 can be turned off by the first gate voltage S1($n$). In addition, the first, second, and ninth transistors T1, T2, and T9 can be turned off by the second gate voltage S2($n$). Further, the third, fourth, and seventh transistors T3, T4, and T7 can be turned on by the emission voltage EM(n). Therefore, the voltage of the first electrode of the storage capacitor Cst becomes the high potential voltage VDD, and the voltage of the second electrode of the storage capacitor Cst becomes a value obtained by adding the voltage variance VDD−Vref of the first electrode to the value VDR−Vth obtained by subtracting the threshold voltage Vth of the driving transistor DT from the right data voltage VDR, that is, (VDR−Vth)+(VDD−Vref), due to boosting. Accordingly, the voltage of the gate electrode of the driving transistor DT becomes the value (VDR−Vth)+(VDD−Vref) obtained by adding the voltage variance VDD−Vref of the first electrode to the value VDR−Vth obtained by subtracting the threshold voltage Vth of the driving transistor DT from the right data voltage VDR. For example, the voltage of the first node N1 of the storage capacitor Cst becomes the high potential voltage VDD, and the voltage of the second node N2 of the storage capacitor Cst becomes the value (VDR−Vth)+ (VDD−Vref) obtained by adding the voltage variance VDD− Vref of the first electrode to the value VDR−Vth obtained by subtracting the threshold voltage Vth of the driving transistor DT from the right data voltage VDR due to boosting. Accordingly, the voltage of the gate electrode of the driving transistor DT becomes the value (VDR−Vth)+(VDD−Vref) obtained by adding the voltage variance VDD−Vref of the first electrode to the value VDR−Vth obtained by subtracting the threshold voltage Vth of the driving transistor DT from the right data voltage VDR.

Next, the (n+1)th sub-pixel SP(n+1) is driven substantially the same as the nth sub-pixel SP(n). However, in the (n+1)th sub-pixel SP(n+1), during the initialization period TP1, the voltage of the anode of the light-emitting diode De of the nth sub-pixel SP(n) can be the initialization voltage Vini. In addition, during the sampling period TP2, the voltage of the second electrode N2 of the storage capacitor Cst can be a value VDL−Vth obtained by subtracting the threshold voltage Vth of the driving transistor DT from the left data voltage VDL. Further, during the emission period TP3, the voltage of the second electrode N2 of the storage capacitor Cst becomes a value (VDL−Vth)+(VDD−Vref) obtained by adding the voltage variance VDD−Vref of the first electrode to the value VDL−Vth obtained by subtracting the threshold voltage Vth of the driving transistor DT from the left data voltage VDL due to boosting. For example, during the sampling period TP2, the voltage of the gate electrode of the driving transistor DT can be the value VDL−Vth obtained by subtracting the threshold voltage Vth of the driving transistor DT from the left data voltage VDL. Further, during the emission period TP3, the voltage of the gate electrode of the driving transistor DT becomes the value (VDL−Vth)+(VDD−Vref) obtained by adding the voltage variance VDD−Vref of the first electrode to the value VDL−Vth obtained by subtracting the threshold voltage Vth of the driving transistor DT from the left data voltage VDL.

In the display device according to the embodiment of the present disclosure, the sampling time can be increased by overlapping the sampling period TP2 of the nth sub-pixel SP(n) and the sampling period TP2 of the (n+1)th sub-pixel SP(n+1).

Specifically, in the display device according to the embodiment of the present disclosure, the right data voltage VDR is applied to the nth sub-pixel SP(n), and subsequently, the left data voltage VDL is applied to the (n+1)th sub-pixel SP(n+1). At this time, while the left data voltage VDL is applied to the (n+1)th sub-pixel SP(n+1), the right data voltage VDR of the nth sub-pixel SP(n) is maintained, so that the right data voltage can be utilized in the sampling period TP2 of the nth sub-pixel SP(n).

Accordingly, the sampling period TP2 is increased to 2 horizontal periods 2H. Since the sampling time for measuring the threshold voltage Vth of the driving transistor DT can be sufficiently secured, more accurate compensation is possible.

Meanwhile, in the present disclosure, the sampling error may occur due to the parasitic capacitor because the left and right data lines are provided at respective sides of one vertical pixel row. However, the display device according to the embodiment of the present disclosure has a structure for preventing the parasitic capacitor.

Figure 5:
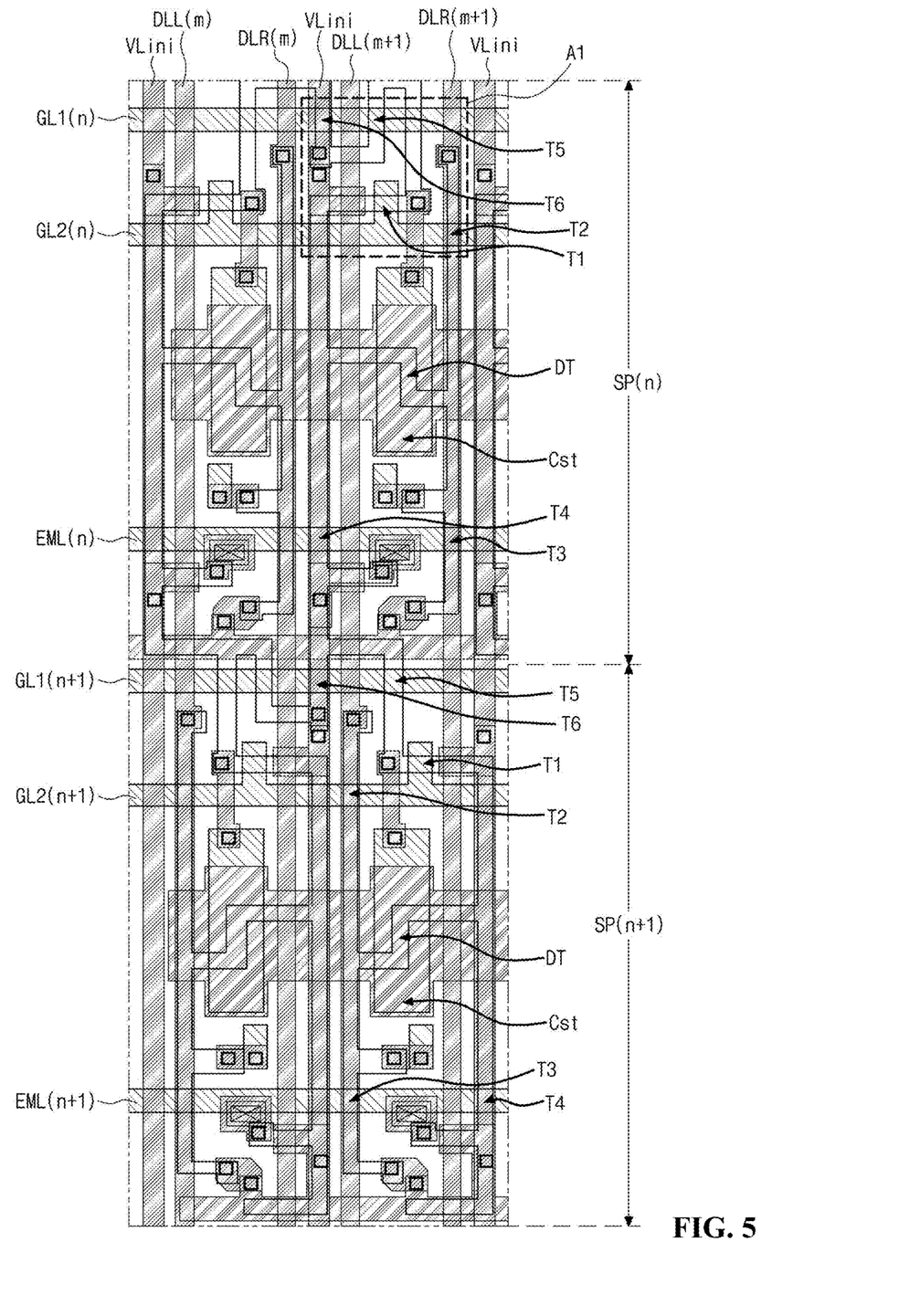
FIG. 5 is a schematic plan view of a display device according to the embodiment of the present disclosure.

FIG. 5 is a schematic plan view of a display device according to the embodiment of the present disclosure, and it will be described with reference to FIG. 3 together. Here, FIG. 5 shows nth and (n+1)th sub-pixels SP(n) and SP(n+1) of two vertical pixel rows.

In FIG. 5, first gate lines GL1(n) and GL1(n+1), second gate lines GL2(n) and GL2(n+1), and emission lines EML (n) and EML(n+1) extend in a first direction. Left data lines DLL(m) and DLL(m+1), right data lines DLR(m) and DLR(m+1), and an initialization line VLini extend in a second direction. The first gate lines GL1(n) and GL1(n+1), the second gate lines GL2(n) and GL2(n+1), and the emission lines EML(n) and EML(n+1) cross the left data lines DLL(m) and DLL(m+1), the right data lines DLR(m) and DLR(m+1), and the initialization line VLini to thereby define sub-pixels SP(n) and SP(n+1).

A driving transistor DT, first to sixth transistors T1 to T6, and a storage capacitor Cst are provided in each sub-pixel SP(n) and SP(n+1).

The driving transistor DT is connected to an electrode of the storage capacitor Cst and the second transistor T2. The first transistor T1 is connected to the second gate line GL2(n) and GL2(n+1), the driving transistor DT, and the fourth transistor T4. The second transistor T2 is connected to the second gate line GL2(n) and GL2(n+1) and the left data line DLL(m) and DLL(m+1) or the right data line DLR(m) and DLR(m+1). The third transistor T3 is connected to the emission line EML(n) and EML(n+1) and the second transistor T2. The fourth transistor T4 is connected to the emission line EML(n) and EML(n+1) and the driving transistor DT. The fifth transistor T5 is connected to the first gate line GL1(n) and GL1(n+1) and the sixth transistor T6. The sixth transistor T6 is connected to the first gate line GL1(n) and GL1(n+1) and the initialization line VLini. The storage capacitor Cst is connected to the driving transistor DT and the first and fifth transistors T1 and T5.

Here, the first transistor T1 can have a double gate structure, and the fifth and sixth transistors T6 and T6 can form a dual gate structure.

Meanwhile, as described above, each sub-pixel SP(n) and SP(n+1) further includes seventh to ninth transistors T7 to T9. The seventh to ninth transistors T7 to T9 are provided separately and shared by three sub-pixels adjacent along the first direction and are omitted in the figure.

In the display device according to the embodiment of the present disclosure, the first transistor T1 overlaps the data line not involved in driving. That is, the first transistor T1 of the nth sub-pixel SP(n) overlaps the left data line DLL(m+ 1), and the first transistor T1 of the (n+1)th sub-pixel SP(n+1) overlaps the right data line DLR(m+1). According to this, the sampling error may occur due to coupling. However, in the display device of the present disclosure, a data shielding layer is further provided, thereby preventing the coupling. This will be described in detail with reference to FIG. 6 and FIG. 7.

Figure 6:
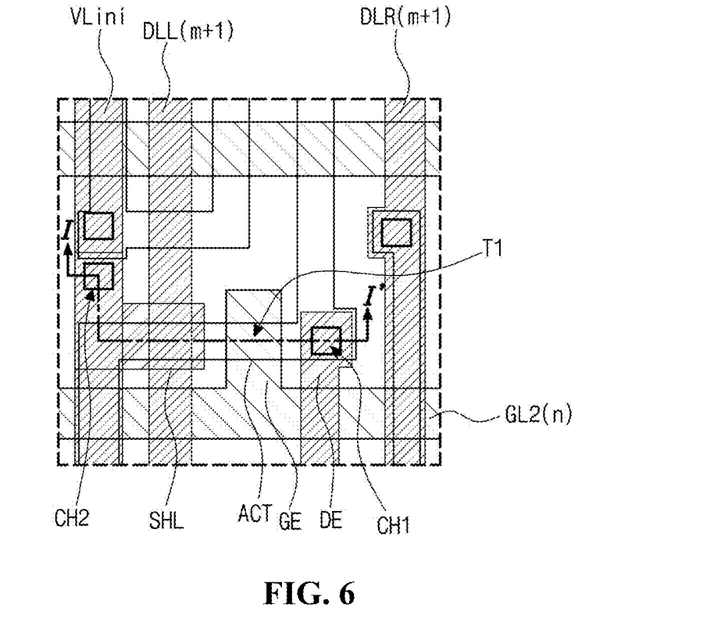
FIG. 6 is a plan view enlarging the area A1 of FIG. 5.
Figure 7:
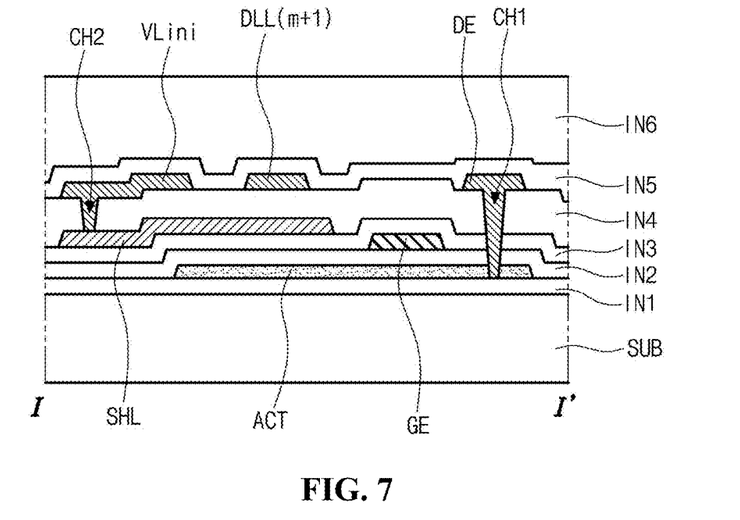
FIG. 7 is a cross-sectional view corresponding to the line I-I' of FIG. 6.

FIG. 6 is a plan view enlarging the area A1 of FIG. 5, and FIG. 7 is a cross-sectional view corresponding to the line I-I' of FIG. 6.

In FIG. 6 and FIG. 7, a first insulation layer IN1 of a buffer layer is formed on a substrate SUB, and an active layer ACT is formed on the first insulation layer IN1.

A second insulation layer of a gate insulation layer is formed on the active layer ACT, and a gate electrode GE is formed on the second insulation layer IN2.

A third insulation layer IN3 of a first interlayer insulation layer is formed on the gate electrode GE, and a data shielding layer SHL is formed on the third insulation layer IN3.

A fourth insulation layer IN4 of a second interlayer insulation layer is formed on the data shielding layer SHL. The fourth insulation layer IN4 has a first contact hole CH1 exposing the active layer ACT and a second contact hole CH2 exposing the data shielding layer SHL. The first contact hole CH1 is also formed in the second and third insulation layers IN2 and IN3. In addition, the first contact hole CH1 can also be formed in the active layer ACT, and in this case, side surfaces of the active layer ACT can be exposed.

A drain electrode DE, the left data line DLL(m+1), and the initialization line VLini are formed on the fourth insulation layer IN4. The drain electrode DE is in contact with the active layer ACT through the first contact hole CH1, and the initialization line VLini is in contact with the data shielding layer SHL through the second contact hole CH2. Here, the drain electrode DE can be in contact with the side surfaces of the active layer ACT.

A fifth insulation layer IN5 of a passivation layer and a sixth insulation layer IN6 of an overcoat layer are sequentially formed on the drain electrode DE, the left data line DLL(m+1), and the initialization line VLini. The sixth insulation layer IN6 has a flat top surface.

Meanwhile, an anode (not shown) of the light-emitting diode is formed on the sixth insulation layer IN6.

In the display device according to the embodiment of the present disclosure, the left data line DLL(m+1) overlaps the active layer ACT of the first transistor T1. As described above, during the sampling period TP2, the first transistor T1 is turned on, and the threshold voltage Vth of the driving transistor DT is measured. Since the left data line DLL(m+1) receiving the different data voltages every frame overlaps the active layer ACT, the sampling error can occur due to the coupling between the left data line DLL(m+1) and the active layer ACT. However, in the present disclosure, the data shielding layer SHL is formed between the left data line DLL(m+1) and the active layer ACT, and the data shield layer SHL is connected to a fixed DC voltage. For example, the data shielding layer SHL is connected to the initialization line VLini receiving the initialization voltage Vini. Accordingly, the sampling error can be preventing by blocking the coupling due to the left data line DLL(m+1).

In the present disclosure, it is described as an example that the data shielding layer SHL is connected to the initialization line VLini, but is not limited thereto. Alternatively, the data shielding layer SHL can be connected to the reference voltage Vref, the high potential voltage VDD, or the low potential voltage VSS or can be connected to another DC voltage.

The data shielding layer SHL is formed of the same material and on the same layer as the electrode of the storage capacitor Cst. Accordingly, a process for forming the data shielding layer SHL is not added. Meanwhile, the other electrode of the storage capacitor Cst is formed of the same material and on the same layer as the gate electrode GE. Here, the other electrode of the storage capacitor Cst can be formed as one body with the gate electrode GE.

However, the present disclosure is not limited thereto. The data shielding layer SHL can be formed of the same material and on the same layer as the gate electrode GE.

The display device of the present disclosure can have a landscape structure.

Figure 8:
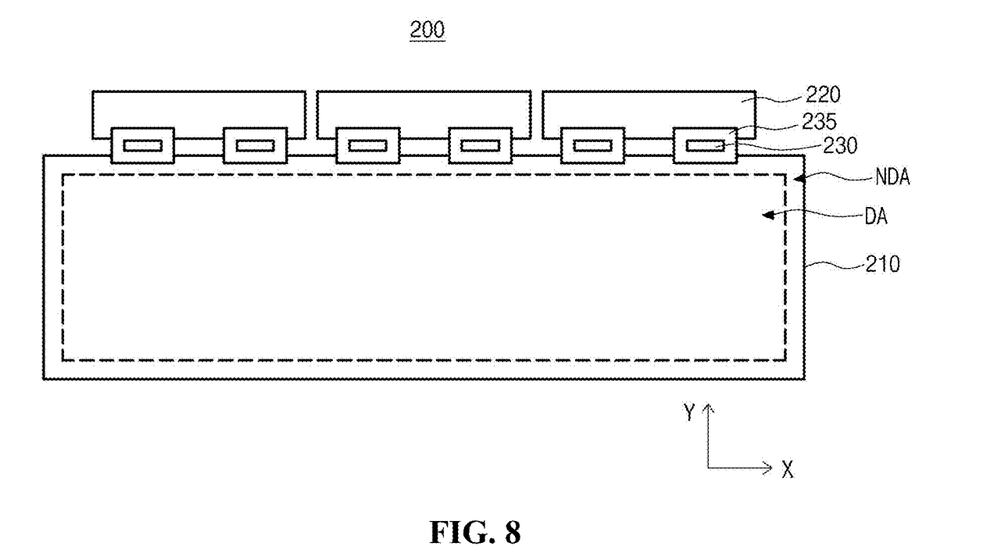
FIG. 8 is a schematic view of a display device having a landscape structure according one embodiment of the present disclosure.

FIG. 8 is a schematic view of a display device having a landscape structure according one embodiment of the present disclosure.

In FIG. 8, the display device 200 according to the embodiment of the present disclosure includes a display panel 210 having long sides parallel to an X direction and short sides parallel to a Y direction. The long sides are longer than the short sides. The display panel 210 includes a display area DA displaying an image and a non-display area NDA surrounding the display area DA.

Although not shown in the figure, a plurality of gate lines and a plurality of left and right data lines are disposed in the display area DA. The plurality of gate lines extends in the X direction, and the plurality of left and right data lines extends in the Y direction.

A printed circuit board 220 is connected to the non-display area NDA corresponding to the long side of the display panel 210. The printed circuit board 220 is electrically connected to the display panel 210 through an intermediate member 235 such as a flexible printed circuit (FPC), tape, or film. A driver integrated circuit (D-IC) 230 is mounted on the intermediate member 235. The printed circuit board 220 includes the timing controlling part and the like and provides the image data and the control signals to the driver integrated circuit 230. The driver integrated circuit 230 corresponds to the data driving part and generates and provides the data voltage to the display panel 210.

The printed circuit board 220 is connected to the display panel 210 through two intermediate members 235 and three printed circuit boards 220 are used, but is not limited thereto. The number of printed circuit boards 220 and/or the number of intermediate members 235 can be varied.

In the display device 200 of the present disclosure having the landscape structure, the sub-pixels of one vertical pixel row are alternately connected to the left data line and the right data line to receive the data voltages, so that the sampling time can be increased. In addition, since the left data line and the right data line are connected to one output terminal of the data driving part, the number of the output terminals of the data driving part is not increased. Accordingly, the number of the driver integrated circuits 230 is also not increased.

Alternatively, the display device of the present disclosure can be applied to a portrait structure.

Figure 9:
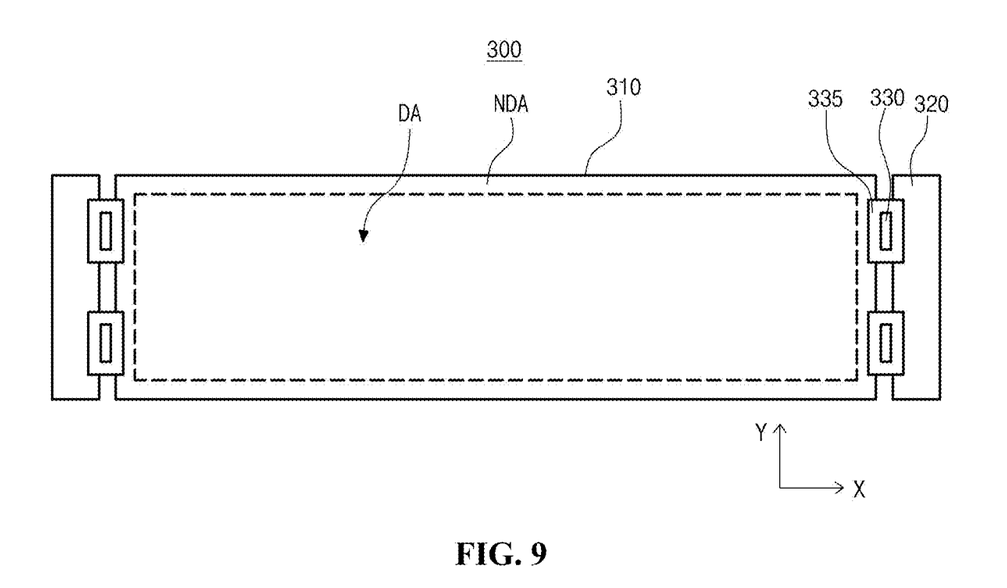
FIG. 9 is a schematic view of a display device having a portrait structure according another embodiment of the present disclosure.

FIG. 9 is a schematic view of a display device having a portrait structure according another embodiment of the present disclosure.

In FIG. 9, the display device 300 according to the another embodiment of the present disclosure includes a display panel 310 having long sides parallel to an X direction and short sides parallel to a Y direction. The long sides are longer than the short sides. The display panel 310 includes a display area DA displaying an image and a non-display area NDA surrounding the display area DA.

Although not shown in the figure, a plurality of gate lines and a plurality of left and right data lines are disposed in the display area DA. The plurality of gate lines extends in the Y direction, and the plurality of left and right data lines extends in the X direction. Here, the sub-pixels of a vertical pixel row are connected to the same gate line, and the sub-pixels of a horizontal pixel row are alternately connected to the left data line and the right data line.

A printed circuit board 320 is connected to the non-display area NDA corresponding to the short side of the display panel 310. The printed circuit board 320 is electrically connected to the display panel 310 through an intermediate member 335 such as a flexible printed circuit (FPC), tape, or film. A driver integrated circuit (D-IC) 330 is mounted on the intermediate member 335. The printed circuit board 320 includes the timing controlling part and the like and provides the image data and the control signals to the driver integrated circuit 330. The driver integrated circuit 330 corresponds to the data driving part and generates and provides the data voltage to the display panel 310.

The printed circuit board 320 can be attached to each short side of the display panel 310.

The printed circuit board 320 is connected to the display panel 310 through two intermediate members 335 and two printed circuit boards 320 are used, but is not limited thereto. The number of printed circuit boards 320 and/or the number of intermediate members 335 can be varied.

In the display device 300 of the present disclosure having the portrait structure, the sub-pixels of one horizontal pixel row are alternately connected to the left data line and the right data line to receive the data voltages, so that the sampling time can be increased. In addition, since the left data line and the right data line are connected to one output terminal of the data driving part, the number of the output terminals of the data driving part is not increased. Accordingly, the number of the driver integrated circuits 330 is also not increased.

Further, in the display device 300 having the portrait structure, since the number of the pixels corresponding to the short side is smaller than the number of the pixels corresponding to the long side, the number of data driving part can be reduced compared to the display device 200 having the landscape structure of FIG. 8. Accordingly, the number of the driver integrated circuits 330 can be reduced.

Recently, as the resolution and the size of the display device increase, the length of the long side of the display device is greatly increased compared to the short side. In the display device 300 having the portrait structure, the driver integrated circuits 330 are disposed to correspond to the short sides, so that the cost of the driver integrated circuit 330 is not increased or is minimized even if the resolution and the size of the display device 300.

As described above, in the display device 300 having the portrait structure according to another embodiment of the present disclosure, although the number of pixels increases, the size and number of data driving parts are minimized or decreased, thereby reducing the manufacturing costs.

Moreover, in the display device 300 having the portrait structure, since the data driving part is not provided at the long sides, it is easy to apply to a flexible display, and it is possible to implement multi curves.

In the present disclosure, the data voltages are supplied to the sub-pixels of the display panel through the dual data lines of the left data line and the right data line, so that the sufficient time for charging the dual data lines, that is, the sufficient sampling time can be secured.

In addition, since the left and right data lines are connected to one output terminal of the data driving part, the number of the output terminals of the data driving part is not increased. Accordingly, the size and number of the data driving parts are not increased.

Further, the display device of the present disclosure is applied to the portrait structure. Even if the number of the pixels increases, the size and number of the data driving parts are minimized or decreased, so that the manufacturing costs can be reduced. Moreover, it is easy to apply to the flexible display, and it is possible to implement the multi curves.

It will be apparent to those skilled in the art that various modifications and variations can be made in the display device of the present disclosure without departing from the technical idea or scope of the disclosure. Thus, it is intended that the present disclosure covers the modifications and variations of this disclosure provided they come within the scope of the appended claims and their equivalents.

What is claimed is:

1. A display device comprising:
a gate line extending in a first direction;
a left data line and a right data line extending in a second direction and crossing the gate line; and
a plurality of sub-pixels arranged along the first and second directions,
wherein the sub-pixels of a pixel row of the first direction are connected to a same gate line, and the sub-pixels of a pixel row of the second direction are alternately connected to the left data line and the right data line,
wherein each of the plurality of sub-pixels includes a driving transistor, first, second, third, fourth, fifth, sixth, seventh, eighth, and ninth transistors, and a light-emitting diode,
wherein the first, second, third, fourth, fifth, sixth, seventh, eighth, and ninth transistors are switched according to a first gate voltage, a second gate voltage, and an emission voltage,
wherein the driving transistor is switched according to a voltage of one electrode of a storage capacitor and is connected to the second transistor,
wherein the first transistor is switched according to the second gate voltage and is connected to the driving transistor and the fourth transistor,
wherein the second transistor is switched according to the second gate voltage and transmits a data voltage,
wherein the third transistor is switched according to the emission voltage and is connected to the second transistor,
wherein the fourth transistor is switched according to the emission voltage and is connected to the driving transistor,
wherein the fifth transistor is switched according to the first gate voltage and transmits an initialization voltage,
wherein the sixth transistor is switched according to the first gate voltage and transmits the initialization voltage,
wherein the seventh transistor is switched according to the emission voltage and transmits a high potential voltage,
wherein the eighth transistor is switched according to the first gate voltage and transmits a reference voltage,
wherein the ninth transistor is switched according to the second gate voltage and transmits the reference voltage, and
wherein the light-emitting diode is connected to the fourth transistor.

2. The display device of claim 1, where the gate line includes a first gate line and a second gate line.

3. The display device of claim 1, wherein the fifth and sixth transistors form a double gate structure.

4. The display device of claim 3, wherein the fifth and sixth transistors are connected to a light-emitting diode of a previous sub-pixel in the pixel of the second direction.

5. The display device of claim 1, wherein the first transistor has a double gate structure.

6. The display device of claim 1, wherein a data shielding layer is disposed between the first transistor and the left data line or the right data line, and the data shield layer is connected to a DC voltage.

7. The display device of claim 6, wherein the DC voltage is one of the initialization voltage, the reference voltage, the high potential voltage, and a low potential voltage.

8. The display device of claim 6, wherein the data shielding layer is formed of a same material and on a same layer as the one electrode of the storage capacitor.

9. The display device of claim 1, further comprising first and second mux switches sequentially transmitting data voltages to the left data line and the right data line,
wherein the first and second mux switches are connected to one output terminal of a data driving part.

10. The display device of claim 1, wherein the display device has a short side parallel to the first direction and a long side parallel to the second direction and longer than the short side.

11. The display device of claim 10, wherein a data driving part is disposed at the short side.

12. The display device of claim 1, wherein each of the plurality of sub-pixels further includes the storage capacitor, and
wherein the one electrode of the storage capacitor is connected to the driving transistor and the first, fifth, and sixth transistors, and another electrode of the storage capacitor is connected to the seventh, eighth, and ninth transistors.

13. The display device of claim 1, wherein the fifth transistor is configured to receive the initialization voltage through the sixth transistor.

14. The display device of claim 1, wherein the fifth transistor is connected between the first transistor and the sixth transistor.

15. The display device of claim 1, wherein the third transistor is connected to the high potential voltage.

* * * * *